United States Patent
Ikeda

(10) Patent No.: US 12,553,121 B2
(45) Date of Patent: Feb. 17, 2026

(54) MANUFACTURING METHOD OF GALLIUM NITRIDE FILM

(71) Applicant: Japan Display Inc., Tokyo (JP)

(72) Inventor: Masanobu Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 267 days.

(21) Appl. No.: 18/366,969

(22) Filed: Aug. 8, 2023

(65) Prior Publication Data

US 2023/0374649 A1 Nov. 23, 2023

Related U.S. Application Data

(63) Continuation of application No. PCT/JP2022/000256, filed on Jan. 6, 2022.

(30) Foreign Application Priority Data

Feb. 19, 2021 (JP) .................. 2021-025261

(51) Int. Cl.
*C23C 14/06* (2006.01)
*C23C 14/34* (2006.01)
(Continued)

(52) U.S. Cl.
CPC ...... *C23C 14/0617* (2013.01); *C23C 14/3407* (2013.01); *C23C 14/3485* (2013.01);
(Continued)

(58) Field of Classification Search
CPC ............ C23C 14/0617; C23C 14/3407; C23C 14/3485; C23C 14/0036; C23C 14/0057;
(Continued)

(56) References Cited

U.S. PATENT DOCUMENTS

2010/0273290 A1* 10/2010 Kryliouk ............. C23C 16/4405
257/E51.001
2013/0273346 A1* 10/2013 Mesuda ................. C22C 29/16
428/221
(Continued)

FOREIGN PATENT DOCUMENTS

JP 2013125851 A * 6/2013
JP 2016204748 A 12/2016
(Continued)

OTHER PUBLICATIONS

WO-2019167715-A1 Translation (Year: 2019).*
(Continued)

*Primary Examiner* — Patrick S Ott
(74) *Attorney, Agent, or Firm* — Maier & Maier, PLLC

(57) ABSTRACT

A method for manufacturing a gallium nitride film includes the steps of placing a substrate so as to face a target containing nitrogen and gallium in a vacuum chamber, supplying a sputtering gas into the vacuum chamber, supplying a nitrogen radical into the vacuum chamber, generating a plasma of the sputtering gas by application of a voltage to the target, generating a gallium ion by a collision of an ion of the sputtering gas with the target, and stopping the application of the voltage to the target and depositing gallium nitride on the substrate. The gallium nitride is generated by a reaction of the gallium ion with a nitrogen anion which is generated by a reaction of an electron in the vacuum chamber with the nitrogen radical.

18 Claims, 9 Drawing Sheets

(51) Int. Cl.
*H01J 37/32* (2006.01)
*H01J 37/34* (2006.01)
*H01L 21/02* (2006.01)
*H10D 30/47* (2025.01)
*H10H 20/01* (2025.01)

(52) U.S. Cl.
CPC ...... *H01J 37/3244* (2013.01); *H01J 37/3429* (2013.01); *H01J 2237/332* (2013.01); *H01L 21/0254* (2013.01); *H01L 21/02631* (2013.01); *H10D 30/475* (2025.01); *H10H 20/01335* (2025.01)

(58) Field of Classification Search
CPC .............. C23C 14/3414; H01J 37/3244; H01J 37/3429; H01J 2237/332; H01L 21/0254; H01L 21/02631; H01L 21/0242; H01L 21/02422; H01L 21/02458; H01L 21/02488; H01L 21/02502; H10D 30/475; H10D 30/4755; H10D 62/8503; H10D 64/111; H10H 20/01335
See application file for complete search history.

(56) References Cited

U.S. PATENT DOCUMENTS

2018/0072570 A1   3/2018  Mesuda et al.
2021/0217618 A1*  7/2021  Takahashi ............... C23C 14/34

FOREIGN PATENT DOCUMENTS

| JP | 2020164927 A | 10/2020 | |
|---|---|---|---|
| WO | 2016009577 A1 | 1/2016 | |
| WO | WO-2019167715 A1 * | 9/2019 | ............ C23C 14/34 |
| WO | 2020075599 A1 | 4/2020 | |

OTHER PUBLICATIONS

JP-2013125851-A Translation (Year: 2013).*
International Search Report mailed on Mar. 1, 2022, in corresponding International Application No. PCT/JP2022/000256, 7 pages.
Office Action issued on Sep. 3, 2024, in corresponding Japanese Application No. 2023-500606, 10 pages.

* cited by examiner

MANUFACTURING METHOD OF GALLIUM NITRIDE FILM

CROSS-REFERENCE TO RELATED APPLICATIONS

This application is a Continuation of International Patent Application No. PCT/JP2022/000256, filed on Jan. 6, 2022, which claims the benefit of priority to Japanese Patent Application No. 2021-025261, filed on Feb. 19, 2021, the entire contents of which are incorporated herein by reference.

FIELD

An embodiment of the present invention relates to a method for manufacturing a gallium nitride film.

BACKGROUND

In a small or medium-sized display device such as a smart phone, a display using liquid crystals or OLEDs (Organic Light Emitting Diodes) has been commercialized. In particular, an OLED display device using the OLEDs which are self-light emitting elements has the advantages of high-contrast and does not require a backlight, as compared with a liquid crystal display device. However, since the OLEDs are composed of organic compounds, it is difficult to secure high reliability of the OLED display device due to deterioration of the organic compounds.

In recent years, a so-called micro LED display device and a mini LED display device in which minute LED chips are mounted in pixels of a circuit substrate have been developed as next-generation display devices. The LED is a self-light emitting element similar to the OLED, but unlike OLED, the LED is composed of stable inorganic compounds containing gallium (Ga) or indium (In), and therefore, it is easy to ensure high reliability of the micro LED display device as compared with the OLED display device. In addition, the LED has high light emission efficiency and high brightness can be realized. Therefore, the micro LED display device is expected to be a next-generation display with high reliability, high brightness, and high contrast.

A gallium nitride film used in the micro LED and the like are generally formed on a sapphire substrate by Metal Organic Chemical Vapor deposition (MOCVD) or Hydride Vapor Phase Epitaxy (HVPE) at a high temperature of 800° C. to 1000° C. Recently, however, the deposition of the gallium nitride film by sputtering, which can be deposited at relatively low temperatures, has been developed (for example, see Japanese laid-open patent publication No. 2020-164927).

SUMMARY

A method for manufacturing a gallium nitride film according to an embodiment of the present invention includes the steps of placing a substrate so as to face a target containing nitrogen and gallium in a vacuum chamber, supplying a sputtering gas into the vacuum chamber, supplying a nitrogen radical into the vacuum chamber, generating a plasma of the sputtering gas by application of a voltage to the target, generating a gallium ion by a collision of an ion of the sputtering gas with the target, and stopping the application of the voltage to the target and depositing gallium nitride on the substrate. The gallium nitride is generated by a reaction of the gallium ion with a nitrogen anion which is generated by a reaction of an electron in the vacuum chamber with the nitrogen radical.

A method for manufacturing a gallium nitride film according to an embodiment of the present invention includes the steps of placing a substrate so as to face a target containing nitrogen and gallium in a vacuum chamber, supplying a sputtering gas in the vacuum chamber, supplying a nitrogen radical in the vacuum chamber, generating a plasma of the sputtering gas by application of a voltage to the target, generating a gallium ion by a collision of an ion of the sputtering gas with the target, and stopping the application of the voltage to the target and depositing gallium nitride on the substrate. The gallium nitride is generated by a reaction of the gallium ion with a nitride anion which is generated by a reaction of a nitrogen atom generated using a sputtering gas in a metastable state in the vacuum chamber with an electron in the vacuum chamber.

DESCRIPTION OF EMBODIMENTS

Figure 1:
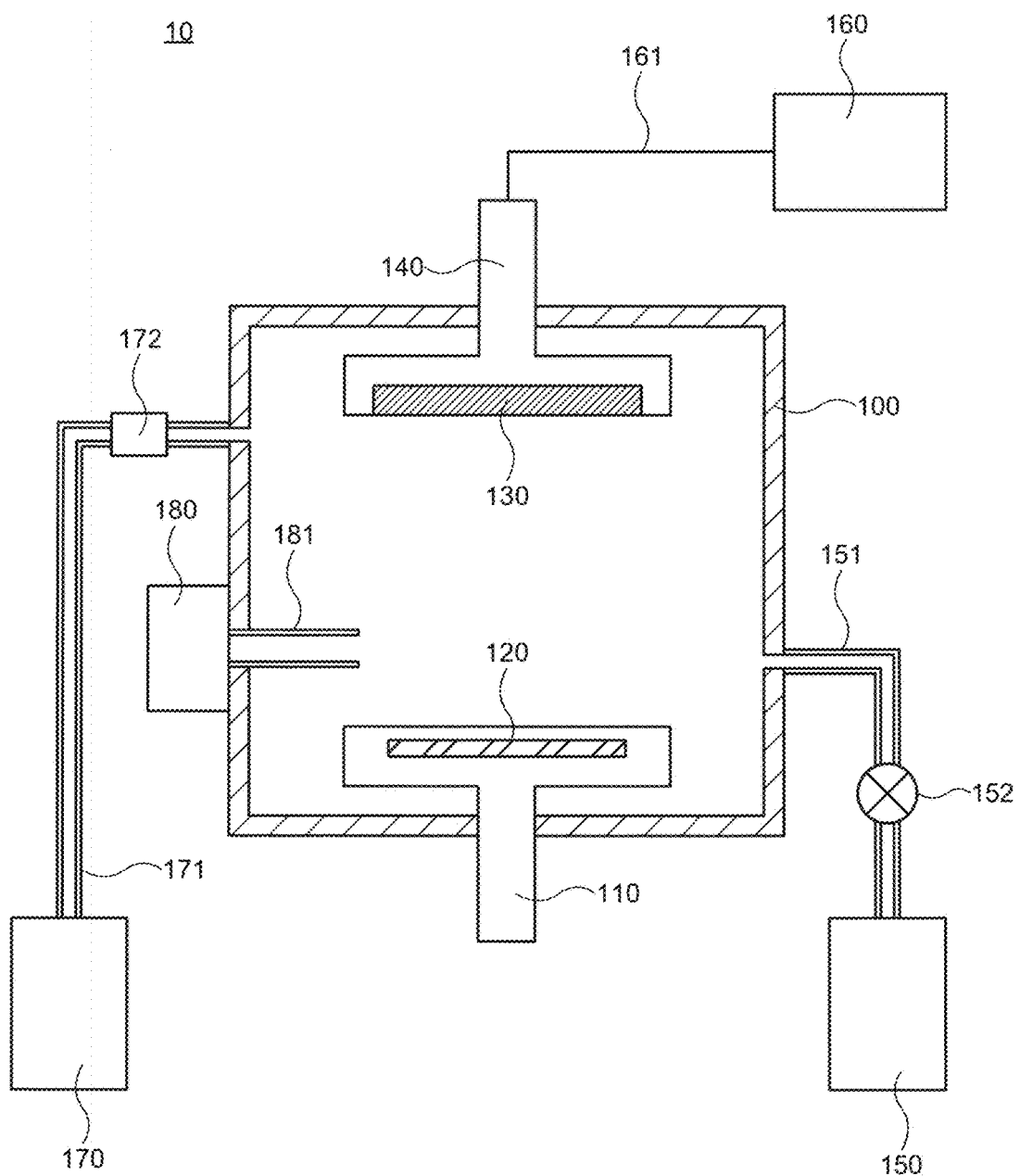
FIG. 1 is a schematic diagram showing a configuration of a film deposition apparatus used in a method for manufacturing a gallium nitride film according to an embodiment of the present invention.

When a gallium nitride film is deposited at a low temperature, it is possible to form a micro LED directly on a glass substrate. However, a gallium nitride film with sufficient quality cannot be obtained.

In view of the above problems, one object of an embodiment of the present invention is to provide a method for manufacturing a gallium nitride film with high quality which is deposited at a low temperature.

Hereinafter, each of the embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "a includes A, B or C", "a includes any of A, B and C", and "a includes one selected from the group consisting of A, B and C" do not exclude the case where a includes a plurality of combinations of A to C unless otherwise specified. Further, these expressions do not exclude the case where a includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a structure over a substrate, one surface of the structure in the direction facing the substrate is the bottom surface of the structure and the other surface is the upper surface of the structure. In addition, the expression of a structure over a substrate only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers overlap in a plan view.

In the specification, terms such as "first", "second", or "third" attached to each configuration are convenient terms used to distinguish each configuration, and have no further meaning unless otherwise explained.

In the specification and the drawings, the same reference numerals may be used when multiple configurations are identical or similar in general, and reference numerals with a lower or upper case alphabet may be used when the multiple configurations are distinguished. Further, reference numerals with a hyphen and a natural number may be used when multiple portions of one configuration are distinguished.

The following embodiments can be combined with each other as long as there is no technical contradiction.

First Embodiment

A method for manufacturing a gallium nitride film according to an embodiment of the present invention is described with reference to FIGS. 1 to 4.

[1. Configuration of Film Deposition Apparatus 10]

FIG. 1 is a schematic diagram showing a configuration of a film deposition apparatus 10 used in a method for manufacturing a gallium nitride film according to an embodiment of the present invention.

As shown in FIG. 1, the film deposition apparatus 10 includes a vacuum chamber 100, a substrate support portion 110, a heating portion 120, a target 130, a target support portion 140, a pump 150, a sputtering power supply source 160, a sputtering gas supply source 170, and a nitrogen radical supply source 180. The film deposition apparatus 10 is a so-called sputtering apparatus.

The substrate support portion 110, the heating portion 120, the target 130 and the target support portion 140 are provided in the vacuum chamber 100. The substrate support portion 110 and the heating portion 120 are provided in the lower part of the vacuum chamber 100. The substrate is placed on the substrate support portion 110. The heating portion 120 is provided inside the substrate support portion 110 and can heat the substrate on the substrate support portion 110. The target 130 and the target support portion 140 are provided in the upper part of the vacuum chamber 100. The target 130 is supported by the target support portion 140 and is provided so as to face the substrate support portion 110.

In addition, although FIG. 1 shows an example in which the substrate support portion 110 and the heating portion 120 are provided in the lower part of the vacuum chamber 100, and the target 130 and the target support portion 140 are provided in the upper part of the vacuum chamber 100, these components may be provided in reverse.

The target 130 is gallium nitride containing nitrogen and gallium. It is preferable that the composition ratio of the gallium nitride of the target 130 is greater than or equal to 0.7 and less than or equal to 2 of gallium to nitrogen. Nitrogen in the gallium nitride film formed over the substrate can be supplied from the nitrogen radical supply source 180, while gallium in the gallium nitride film is supplied only from the target 130. Therefore, it is more preferable that the composition ratio of the gallium nitride in the target 130 is more gallium than nitrogen.

The pump 150, the sputtering power supply source 160, the sputtering gas supply source 170, and the nitrogen radical supply source 180 are provided outside the vacuum chamber 100.

The pump 150 is connected to the vacuum chamber 100 through a pipe 151. The pump 150 can exhaust the gas inside the vacuum chamber 100 through the pipe 151. Further, the pressure inside the vacuum chamber 100 can be kept constant by opening and closing the valve 152 connected to the pipe 151. For example, a turbomolecular pump or a cryopump can be used as the pump 150.

The sputtering power supply source 160 is electrically connected to the target 130 via a wiring 161. The sputtering power supply source 160 can generate a direct current (DC) voltage or an alternating voltage (AC voltage) and can apply the generated voltage to the target 130. The AC voltage is 13.56 MHz. Further, the sputtering power supply source 160 can apply a bias voltage to the target 130 and can further apply a DC voltage or an AC voltage.

The sputtering power supply source 160 may periodically stop the application of the voltage to target 130. The stop time for the application of the voltage to the target 130 is greater than or equal to 2 msec and less than or equal to 10 msec. Further, the application of the voltage from the sputtering power supply source 160 to the target 130 may be in a pulsed form having a predetermined frequency. In this case, the predetermined frequency is greater than or equal to 100 kHz and less than or equal to 500 kHz.

The sputtering gas supply source 170 is connected to the vacuum chamber 100 through a pipe 171. The sputtering gas supply source 170 can supply a sputtering gas into the vacuum chamber 100 through the pipe 171. Further, a mass flow controller 172 connected to the pipe 171 can control the flow rate of the sputtering gas. Argon (Ar) or krypton (Kr) can be used as the sputtering gas supplied from the sputtering gas supply source 170.

The nitrogen radical supply source 180 is connected to a pipe 181 provided in the vacuum chamber 100 and can irradiate nitrogen radicals from the pipe 181 to the substrate placed on the substrate support portion 110. The nitrogen radical supply source 180 can covert a nitrogen gas into a plasma to generate nitrogen radicals.

The nitrogen radical supply source 180 may be provided in the vacuum chamber 100 and may generate nitrogen radicals in the vacuum chamber 100.

[2. Manufacturing Method of Gallium Nitride Film]

A method for manufacturing a gallium nitride film according to an embodiment of the present invention is described with reference to FIGS. 2 to 4. Since the gallium nitride film is manufactured using the film deposition apparatus 10, the following explanation of the method for manufacturing the gallium nitride film may refer to the reference numerals shown in FIG. 1 for the sake of convenience.

Figure 2:
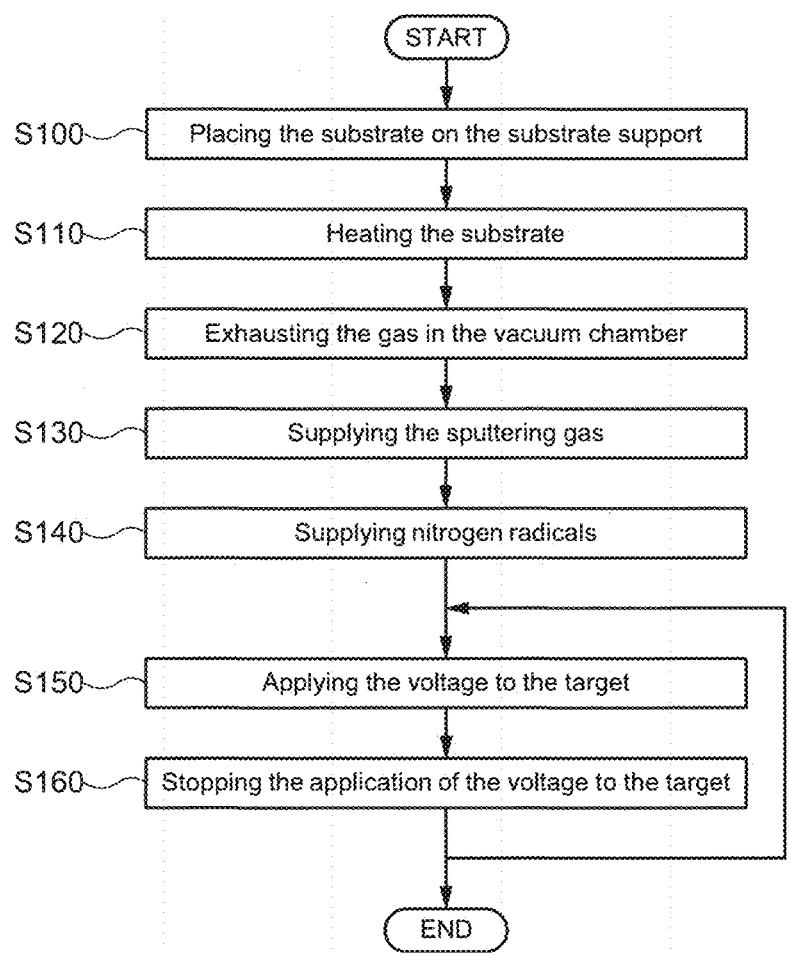
FIG. 2 is a flow chart diagram showing a method for manufacturing a gallium nitride film according to an embodiment of the present invention.

FIG. 2 is a flow chart diagram showing the method for manufacturing the gallium nitride film according to an embodiment of the present invention.

In step S100, the substrate is placed on the substrate support 110 so as to face the target 130. For example, a quartz substrate or a glass substrate can be used as the substrate. Further, a quartz substrate or a glass substrate on which an aluminum nitride film is formed can be used as the substrate.

In step S110, the substrate is heated at a predetermined temperature by the heating portion 120. For example, the predetermined temperature is greater than or equal to 400 degrees and less than 600 degrees.

In step S120, the pump 150 exhausts the gas in the vacuum chamber 100 so that the degree of vacuum is less than or equal to a predetermined degree. For example, the predetermined degree of vacuum is $10^{-6}$ Pa.

In step S130, the sputtering gas supply source 170 supplies the sputtering gas into the vacuum chamber 100. For example, argon or krypton can be used as the sputtering gas. Further, the flow rate of the sputtering gas is adjusted by the mass flow controller 172 so that the pressure in the vacuum chamber 100 becomes a predetermined pressure. For example, the predetermined pressure is greater than or equal to 0.1 Pa and less than or equal 10 Pa.

In step S140, the nitrogen radical supply source 180 supplies nitrogen radicals into the vacuum chamber 100.

In step S150, the sputtering power supply source 160 applies the predetermined voltage to the target 130 so that the target 130 can function as the cathode with respect to the substrate. Thereby, the sputtering gas in the vacuum chamber 100 is turned into a plasma, and ions (specifically, positive ions) and electrons of the sputtering gas are generated. Ions of the sputtering gas are accelerated by the potential difference between the substrate and the target 130 and collide with the target 130. As a result, gallium ions (e.g., gallium cations) are ejected from the target 130.

In step S160, the sputtering power supply source 160 stops the application of the voltage to the target 130. At this time, gallium nitride generated by a reaction can be deposited on the substrate. In the following description, the generation of gallium nitride is described.

Nitrogen radicals are supplied from the nitrogen radical supply source 180 in the step S160. In general, a nitrogen atom or a nitrogen radical has high electronegativity and easily attract electrons. Therefore, the nitrogen radicals react with electrons in the vacuum chamber 100 to generate nitrogen anions. Further, the generated nitrogen anion is recombined with the gallium ion (specifically, the gallium cation) present in the vicinity of the substrate to generate gallium nitride. The generated gallium nitride is deposited on the substrate. Since the recombination reaction between the cation and the anion releases a large amount of energy, the gallium nitride film with high quality is deposited on the substrate even when the temperature of the substrate is low. Thus, in the step S160, the application of the voltage to the target 130 is stopped, and the nitrogen radicals supplied from the nitrogen radical supply source 180 can be used to generate gallium nitride even in a state where sputtering is not performed.

In addition, cations and anions are sometimes referred to as positive ions and negative ions, respectively.

Also, in the step S160, gallium nitride can be generated by using a rare gas in a metastable state.

It is known that a rare gas atom in the metastable state which has a long lifetime is present in rare gas plasma. For example, the metastable state energies of the argon atom and the krypton atom are 11.61 eV and 9.91 eV, respectively. Such an argon atom or a krypton atom in the metastable state is generated in the sputtering plasma and can exist even after the plasma is extinguished due to the long lifetime. That is, the argon atom or the krypton atom in the metastable state can exist even after the application of the voltage to the target 130 is stopped.

After the application of the voltage to the target 130 is stopped, a nitrogen molecule exists in the vacuum chamber 100 in addition to the nitrogen radicals from the nitrogen radical supply source 180. The dissociation energy from a nitrogen molecule to nitrogen atoms due to electron collision is 9.756 eV, which is close to the metastable state energy of the argon atom or the krypton atom. Therefore, when the nitrogen molecule collides with the argon atom or the krypton atom in the metastable state, a dissociation reaction of the nitrogen molecule occurs to generate a nitrogen radical and a nitrogen atom. That is, the nitrogen radical and the nitrogen atom are generated by the argon atom or the krypton atom in the metastable state even after the application of the voltage to the target 130 is stopped. As described above, since the nitrogen radical and the nitrogen atom have high electronegativity, the nitrogen radical and the nitrogen atom react with the electrons in the vacuum chamber 100 to generate nitrogen anions. Further, the generated nitrogen anion recombines with the gallium ion existing in the vicinity of the substrate to generate gallium nitride.

As described above, in the step S160, gallium nitride can be generated by using not only the nitrogen radical but also the argon atom or krypton atom in the metastable state.

In the method for manufacturing the gallium nitride film according to the present embodiment, the gallium nitride film is deposited on the substrate by repeating steps S150 and S160. In the following description, the timing of turning on or off the sputtering power supply source 160 is illustrated with reference to FIGS. 3 and 4.

Figure 3:
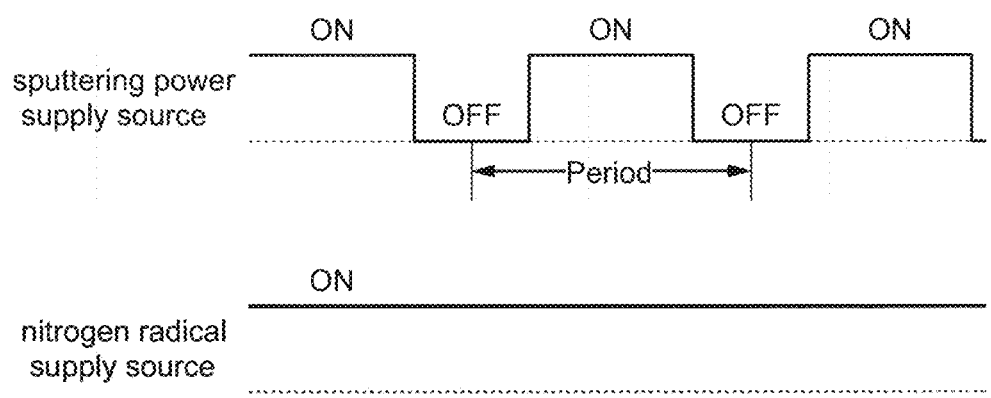
FIG. 3 is a sequence diagram showing timings of turning on or off a sputtering power supply source and a nitrogen radical supply source in a method for manufacturing a gallium nitride film according to an embodiment of the present invention.
Figure 4:
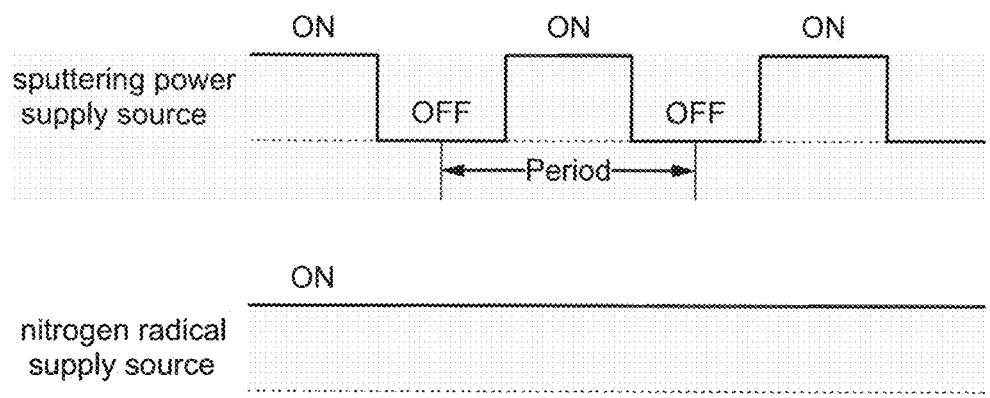
FIG. 4 is a sequence diagram showing timings of turning on or off a sputtering power supply source and a nitrogen radical supply source in a method for manufacturing a gallium nitride film according to an embodiment of the present invention.

FIGS. 3 and 4 are sequence diagrams showing timings of turning on or off the sputtering power supply source 160 and the nitrogen radical supply source 180 in the method for manufacturing the gallium nitride film according to an embodiment of the present invention.

In FIG. 3, the voltage applied to the target 130 is stopped periodically. That is, the sputtering power supply source 160 controls the voltage in a pulsed form so that a first period in which voltage is applied to the target 130 and a second period in which no voltage is applied to the target 130 are periodically repeated. The first period and the second period may be the same time or different times. Although the first period is not particularly limited, the first period may be determined by the time the plasma is stable. The second time period may be determined by the lifetime of the sputtering gas in the metastable state or the lifetime of the nitrogen molecule in the metastable state. For example, the second period is greater than or equal to 2 μsec and less than or equal to 10 msec. Further, for example, the pulse frequency is greater than or equal to 90 Hz and less than or equal to 400 kHz.

In FIG. 4, the sputtering power supply source 160 controls the voltage applied to the target 130 with a pulsed voltage having the same first period and second period. In this case, when the predetermined frequency is determined, the first period and the second period are equally divided. Therefore, the sputtering power supply source 160 can control the voltage applied to the target 130 based on one parameter, frequency. For example, the frequency is greater than or equal to 90 Hz and less than or equal to 400 kHz.

As described above, in the method for manufacturing the gallium nitride film according to the present embodiment, the gallium nitride film can be deposited with high quality while the substrate temperature is low by using nitrogen radicals and the sputtering gas in the metastable state when the application of the voltage to the target 130 is stopped.

Second Embodiment

A method for manufacturing a gallium nitride film according to an embodiment of the present invention, which is different from the First Embodiment, is described with reference to FIGS. 5 to 7. In addition, the configuration described in the First Embodiment may be omitted in the following description.

Figure 5:
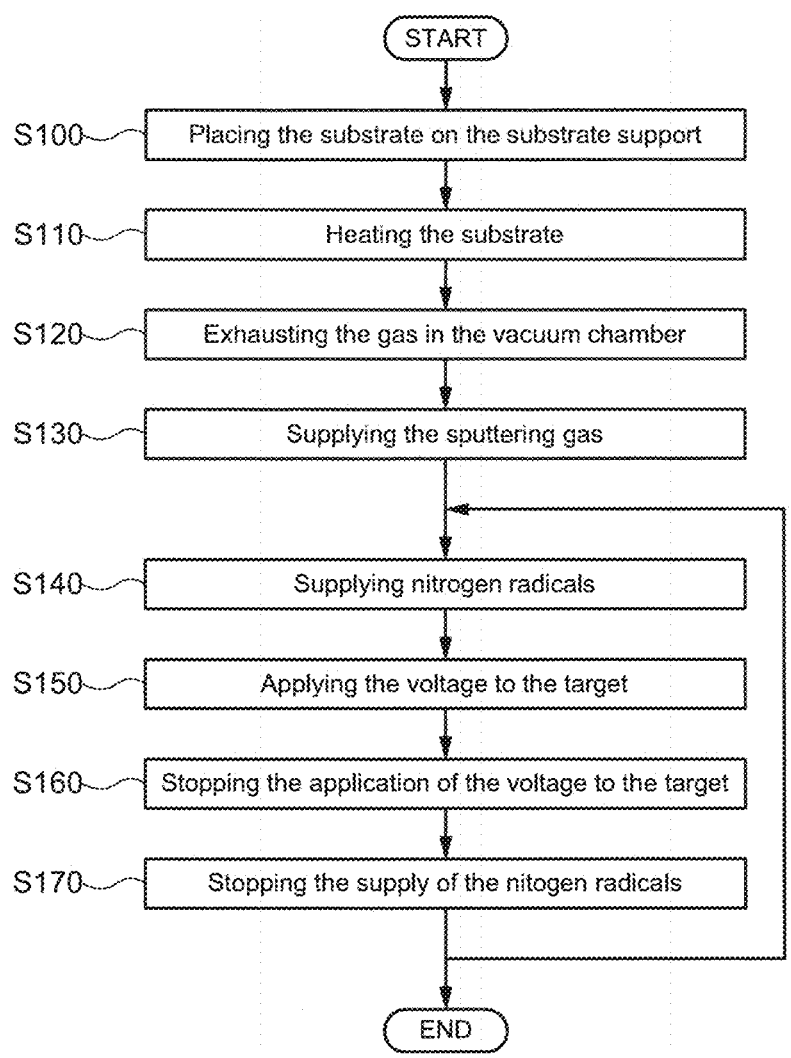
FIG. 5 is a flow chart diagram showing a method for manufacturing a gallium nitride film according to an embodiment of the present invention.

FIG. 5 is a flow chart diagram showing the method for manufacturing the gallium nitride film according to an embodiment of the present invention.

In the method for manufacturing the gallium nitride film according to the present embodiment, step S170 is performed after the step S160 is performed.

In the step S170, the nitrogen radical supply source 180 stops supplying nitrogen radicals into the vacuum chamber 100. In the step S170, since the supply of nitrogen radicals is stopped, the generation of the gallium nitride using the sputtering gas in the metastable state described in the First Embodiment is dominant.

In the method for manufacturing the gallium nitride film according to the present embodiment, the gallium nitride film is deposited on the substrate by repeating the steps S140 to S170. In the following description, timings of turning on or off the sputtering power supply source 160 and the nitrogen radical supply source 180 is illustrated with reference to FIGS. 6 and 7.

Figure 6:
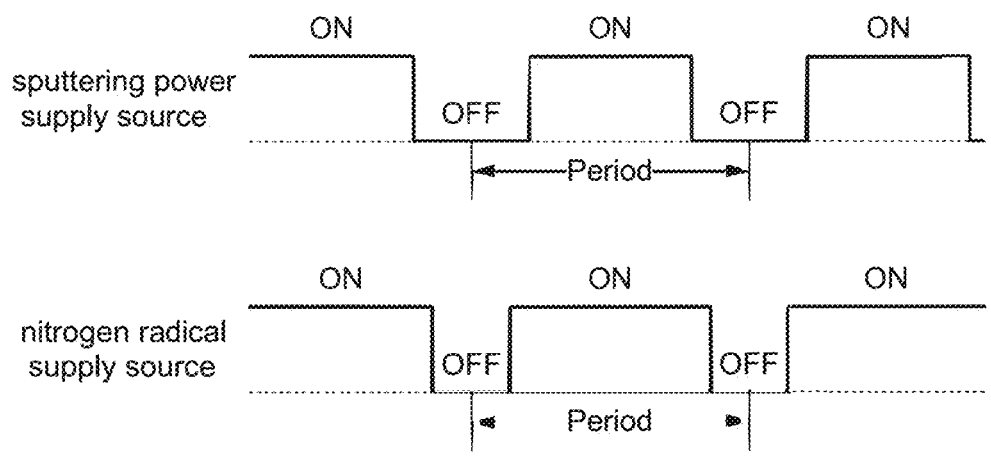
FIG. 6 is a sequence diagram showing timings of turning on or off a sputtering power supply source and a nitrogen radical supply source in a method for manufacturing a gallium nitride film according to an embodiment of the present invention.
Figure 7:
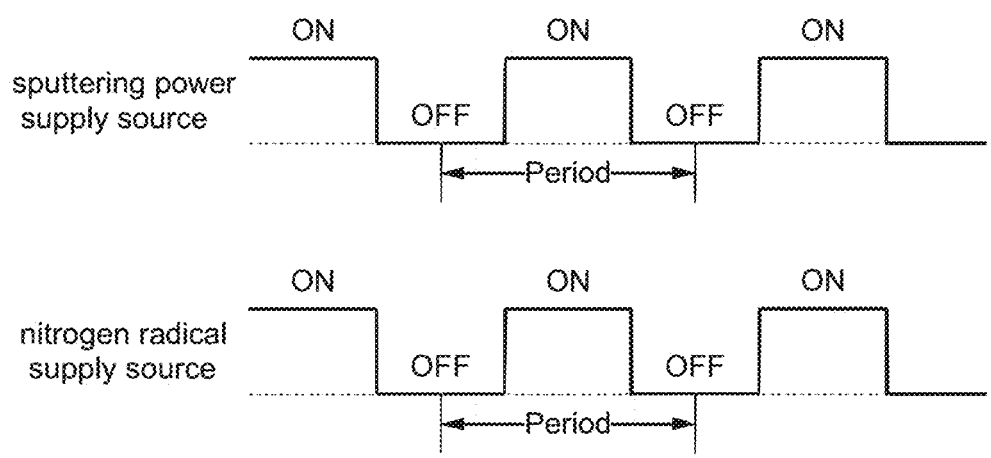
FIG. 7 is a sequence diagram showing timings of turning on or off a sputtering power supply source and a nitrogen radical supply source in a method for manufacturing a gallium nitride film according to an embodiment of the present invention.

FIGS. 6 and 7 are sequence diagrams showing timings of turning on or off the sputtering power supply source 160 and the nitrogen radical supply source 180 in the method for manufacturing a gallium nitride film according to an embodiment of the present invention.

In FIG. 6, the voltage applied to the target 130 is stopped periodically. That is, the sputtering power supply source 160 controls the voltage in a pulsed form so that a first period in which voltage is applied to the target 130 and a second period in which no voltage is applied to the target 130 are periodically repeated. Further, the nitrogen radical supply source 180 stops supplying nitrogen radicals into the vacuum chamber 100 during the second period. The period during which the supply of nitrogen radicals is stopped is shorter than or equal to the second period. That is, the period during which the supply of nitrogen radicals is stopped is greater than or equal to 2 μsec and less than or equal to 10 msec, for example. Further, for example, the pulse frequency is greater than or equal to 90 Hz and less than or equal to 400 kHz.

In FIG. 7, the sputtering power supply source 160 controls the voltage applied to the target 130 with the pulsed voltage of which the first period and second period are the same period. Further, when no voltage is applied to the target 130, the supply of nitrogen radicals into the vacuum chamber 100 is also stopped. That is, the sputtering power supply source 160 and the nitrogen radical supply source are controlled to be synchronized at a predetermined frequency. For example, the pulse frequency is greater than or equal to 90 Hz and less than or equal to 400 kHz.

As described above, in the method for manufacturing the gallium nitride film according to the present embodiment, the gallium nitride film can be deposited with high quality while the substrate temperature is low by using nitrogen radicals and the sputtering gas in the metastable state when the application of the voltage to the target 130 is stopped.

Third Embodiment

Figure 8:
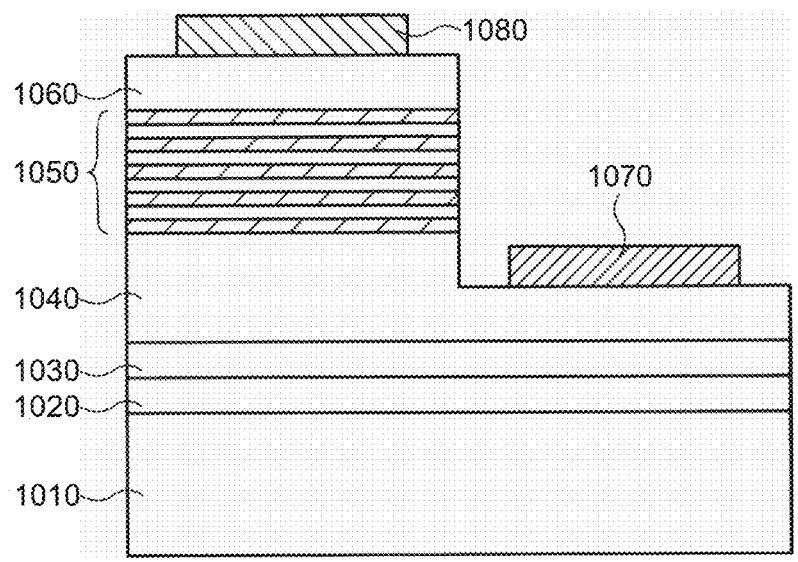
FIG. 8 is a schematic diagram showing a configuration of a light emitting element according to an embodiment of the present invention.

FIG. 8 is a schematic diagram showing a configuration of a light emitting element 1000 according to an embodiment of the invention.

As shown in FIG. 8, the light emitting element 1000 includes a substrate 1010, a barrier layer 1020, a buffer layer 1030, an n-type semiconductor layer 1040, a light emitting layer 1050, a p-type semiconductor layer 1060, an n-type electrode 1070, and a p-type electrode 1080. Although the light emitting element 1000 is a so-called light emitting diode (LED), the light emitting element 1000 is not limited to the LED.

For example, a quartz substrate, a glass substrate, or the like can be used as the substrate 1010. For example, a silicon nitride film can be used as the barrier layer 1020. For example, an aluminum nitride film or the like can be used as the buffer layer 1030. A silicon-doped gallium nitride film or the like can be used as the n-type semiconductor layer 1040. A stacked structure in which an indium gallium nitride film and a gallium nitride film are alternately stacked can be used for the light-emitting layer 1050. A magnesium-doped gallium nitride film or the like can be used as the p-type semiconductor layer 1060. A metal such as indium can be used for the n-type electrode 1070. A metal such as palladium or gold can be used for the p-type electrode 1080.

The method for manufacturing the light emitting element 1000 is as follows. A silicon nitride film and an aluminum nitride film are sequentially deposited on the substrate 1010 to form the barrier layer 1020 and the buffer layer 1030. A silicon-doped gallium nitride film is formed on the buffer layer 1030. Further, an indium gallium nitride film and a gallium nitride film are alternately formed on the buffer layer 1030 to form a stacked structure. Furthermore, a magnesium-doped gallium nitride film is formed on the stacked structure. Then, the magnesium-doped gallium film, the stacked structure, and the silicon-doped gallium nitride film are etched using photolithography to form the p-type semiconductor layer 1060, the light emitting layer 1050, and the n-type semiconductor layer 1040. At this time, etching is performed so as to expose a part of the surface of the silicon-doped gallium nitride film. The n-type electrode 1070 and the p-type electrode 1080 are formed on the n-type semiconductor layer 1040 and the p-type semiconductor layer 1060, respectively.

The method for manufacturing the gallium nitride film described in the First Embodiment or the Second Embodiment can be applied not only to the deposition for the gallium nitride film of the light emitting layer 1050 but also to the formation of the aluminum nitride film of the light emitting layer 1050. When the aluminum gallium nitride film is formed, aluminum gallium nitride containing nitrogen, aluminum, and gallium can be used as the target 130 of the film deposition apparatus 10. Further, when two vacuum chambers are connected via a substrate transfer portion, the gallium nitride film may be formed in one vacuum chamber and the aluminum gallium nitride film may be formed in the other vacuum chamber without breaking the vacuum.

In addition, the method for manufacturing the gallium nitride film described in the First Embodiment or the Second Embodiment can also be applied to the deposition for the aluminum nitride film of the buffer layer 1030, the silicon-doped gallium nitride film of the n-type semiconductor layer 1040, or the magnesium-doped gallium nitride film of the p-type semiconductor layer 1060.

As described above, since the light emitting element 1000 according to the present embodiment can form the gallium nitride film or the like by applying the method for manufacturing the gallium nitride film described in the First Embodiment or the Second Embodiment, the light emitting element 1000 is manufactured using the glass substrate with low heat resistance, for example.

Fourth Embodiment

Figure 9:
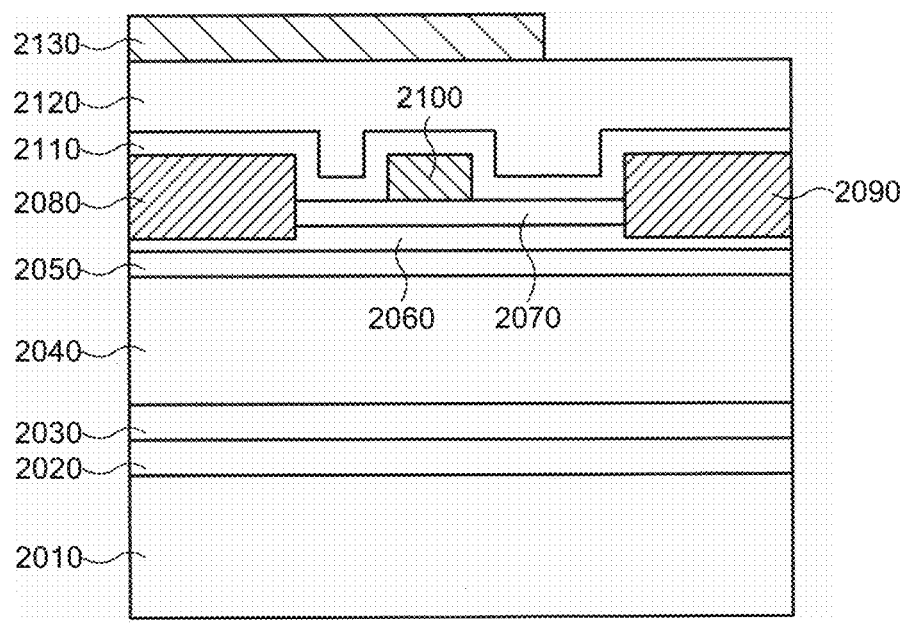
FIG. 9 is a schematic diagram showing a configuration of a semiconductor device according to an embodiment of the present invention.

FIG. 9 is a schematic diagram showing a configuration of a semiconductor device 2000 according to an embodiment of the present invention.

As shown in FIG. 9, the semiconductor element 2000 includes a substrate 2010, a barrier layer 2020, a buffer layer 2030, a gallium nitride layer 2040, a first aluminum gallium nitride layer 2050, a second aluminum gallium nitride layer 2060, a third aluminum gallium nitride layer 2060, an aluminum gallium layer 2070, a source electrode 2080, a drain electrode 2090, a gate electrode 2100, a first insulating layer 2110, a second insulating layer 2120, and a shield electrode 2130. Although the semiconductor element 2000 is a so-called high electron mobility transistor (HEMT), the semiconductor element is not limited to the HEMT.

For example, a quartz substrate, a glass substrate, or the like can be used as the substrate 2010. For example, a silicon nitride film can be used as the barrier layer 2020. For example, an aluminum nitride film can be used as the buffer layer 2030. A gallium nitride film can be used as the gallium nitride layer 2040. An aluminum gallium nitride film can be used as the first aluminum gallium nitride layer 2050. For example, a silicon-doped gallium nitride film can be used as the second aluminum gallium nitride layer 2060. An aluminum gallium nitride film can be used as the third aluminum gallium nitride layer 2070. For example, a metal such as titanium or aluminum can be used for the source electrode 2080 and the drain electrode 2090. For example, a metal such as nickel or gold can be used for the gate electrode 2100. For example, a silicon nitride film can be used as the first insulating layer 2110. For example, a silicon oxide film can be used as the second insulating layer 2120. For example, laminated metal such as aluminum/titanium (Al/Ti) can be used as the shield electrode 2130.

The method for manufacturing the semiconductor element 2000 is as follows. A silicon nitride film, an aluminum nitride film, a gallium nitride film, and an aluminum gallium nitride film are sequentially deposited on the substrate 2010 to form the barrier layer 2020, the buffer layer 2030, the gallium nitride layer 2040, and the first aluminum gallium nitride layer 2050. Further, a silicon-doped aluminum gallium nitride film and an aluminum gallium nitride film are deposited on the first aluminum gallium nitride layer 2050. The aluminum gallium nitride film and the silicon-doped aluminum gallium nitride film are then etched using photolithography to form the third aluminum gallium nitride layer 2070 and the second aluminum gallium nitride layer 2060. At this time, etching is performed so as to partially expose the surface of the silicon-doped aluminum gallium nitride film. The source electrode 2080 and the drain electrode 2090 are formed on the second aluminum gallium nitride layer 2060. Further, the gate electrode 2100 is formed on the third aluminum gallium nitride layer 2070. A silicon nitride film and a silicon oxide film are sequentially deposited to cover the source electrode 2080, the drain electrode 2090, and the gate electrode 2100 to form the first insulating layer 2110 and the second insulating layer 2120. The shield electrode 2130 is formed on the second insulating layer 2120.

The method for manufacturing the gallium nitride film described in the First Embodiment or the Second Embodiment can be applied not only to the deposition for the gallium nitride film of the gallium nitride layer 2040, but also to the deposition for the aluminum nitride film of the buffer layer 2030, the aluminum nitride film of the first aluminum gallium nitride layer 2050, the silicon-doped aluminum gallium nitride film of the second aluminum gallium nitride layer 2060, and the aluminum gallium nitride film of the third aluminum gallium nitride layer 2070.

As described above, since the semiconductor element 2000 according to the present embodiment can form the gallium nitride film or the like by applying the method for manufacturing the gallium nitride film described in the First Embodiment or the Second Embodiment, the semiconductor 2000 is manufactured using the glass substrate with low heat resistance, for example.

Each of the embodiments described above as an embodiment of the present invention can be appropriately combined and implemented as long as they do not contradict each other. Additions, deletions, or design changes of constituent elements, or additions, omissions, or changes to conditions of steps as appropriate based on the respective embodiments are also included within the scope of the present invention as long as the gist of the present invention is provided.

Other effects which differ from those brought about by each of the embodiments described above, but which are apparent from the description herein or which can be readily predicted by those skilled in the art, are naturally understood to be brought about by the present invention.

What is claimed is:

1. A method for manufacturing a gallium nitride film comprising:
   placing a substrate so as to face a target containing nitrogen and gallium in a vacuum chamber;
   supplying a sputtering gas into the vacuum chamber;
   supplying a nitrogen radical into the vacuum chamber;
   generating a plasma of the sputtering gas by application of a voltage to the target;
   generating a gallium ion by a collision of an ion of the sputtering gas with the target; and
   stopping the application of the voltage to the target and stopping the supply of the nitrogen radical into the vacuum chamber to deposit gallium nitride on the substrate, wherein the gallium nitride is generated by a reaction of the gallium ion with a nitrogen anion which is generated by a reaction of an electron in the vacuum chamber with the nitrogen radical.

2. The method for manufacturing a gallium nitride film according to claim 1, wherein a stopping time of the application of the voltage is greater than or equal to 2 usec and less than or equal to 10 msec.

3. The method for manufacturing a gallium nitride film according to claim 2, wherein the application of the voltage to the target is in a pulsed form having a predetermined frequency.

4. The method for manufacturing a gallium nitride film according to claim 3, wherein the predetermined frequency is greater than or equal to 90 Hz and less than or equal to 400 KHz.

5. The method for manufacturing a gallium nitride film according to claim 1, wherein the target comprises gallium nitride with a composition ratio of gallium to nitrogen greater than or equal to 0.7 and less than or equal to 2.

6. The method for manufacturing a gallium nitride film according to claim 1, wherein the target comprises gallium nitride with a composition ratio of more gallium than nitrogen.

7. The method for manufacturing a gallium nitride film according to claim 1, wherein the substrate is a glass substrate.

8. The method for manufacturing a gallium nitride film according to claim 1, wherein the substrate is provided with an aluminum nitride film.

9. The method for manufacturing a gallium nitride film according to claim 1, further comprising a step of heating the substrate at a temperature greater than or equal to 400 degrees and less than 600 degrees.

10. A method for manufacturing a gallium nitride film comprising:
placing a substrate so as to face a target containing nitrogen and gallium in a vacuum chamber;
supplying a sputtering gas in the vacuum chamber;
supplying a nitrogen radical in the vacuum chamber;
generating a plasma of the sputtering gas by application of a voltage to the target;
generating a gallium ion by a collision of an ion of the sputtering gas with the target; and
stopping the application of the voltage to the target and depositing-stopping the supply of the nitrogen radical into the vacuum chamber to deposit gallium nitride on the substrate, wherein the gallium nitride is generated by a reaction of the gallium ion with a nitride anion which is generated by a reaction of a nitrogen atom generated using the sputtering gas in a metastable state in the vacuum chamber with an electron in the vacuum chamber.

11. The method for manufacturing a gallium nitride film according to claim 10, wherein a stopping time of the application of the voltage is greater than or equal to 2 usec and less than or equal to 10 msec.

12. The method for manufacturing a gallium nitride film according to claim 11, wherein the application of the voltage to the target is in a pulsed form having a predetermined frequency.

13. The method for manufacturing a gallium nitride film according to claim 12, wherein the predetermined frequency is greater than or equal to 90 Hz and less than or equal to 400 kHz.

14. The method for manufacturing a gallium nitride film according to claim 10, wherein the target comprises gallium nitride with a composition ratio of gallium to nitrogen greater than or equal to 0.7 and less than or equal to 2.

15. The method for manufacturing a gallium nitride film according to claim 10, wherein the target comprises gallium nitride with a composition ratio of more gallium than nitrogen.

16. The method for manufacturing a gallium nitride film according to claim 10, wherein the substrate is a glass substrate.

17. The method for manufacturing a gallium nitride film according to claim 10, wherein the substrate is provided with an aluminum nitride film.

18. The method for manufacturing a gallium nitride film according to claim 10, further comprising a step of heating the substrate at a temperature greater than or equal to 400 degrees and less than 600 degrees.

* * * * *